(12) United States Patent
Kysar et al.

(10) Patent No.: US 8,418,547 B2
(45) Date of Patent: Apr. 16, 2013

(54) FORCE, PRESSURE, OR STIFFNESS MEASUREMENT OR CALIBRATION USING GRAPHENE OR OTHER SHEET MEMBRANE

(75) Inventors: Jeffrey William Kysar, New York, NY (US); James C. Hone, New York, NY (US); Changgu Lee, New York, NY (US); Xiaoding Wei, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 27 days.

(21) Appl. No.: 13/057,701

(22) PCT Filed: Aug. 6, 2009

(86) PCT No.: PCT/US2009/053033
§ 371 (c)(1),
(2), (4) Date: Mar. 7, 2011

(87) PCT Pub. No.: WO2010/017409
PCT Pub. Date: Feb. 11, 2010

(65) Prior Publication Data
US 2011/0185458 A1 Jul. 28, 2011

Related U.S. Application Data

(60) Provisional application No. 61/188,212, filed on Aug. 7, 2008.

(51) Int. Cl.
*G01L 5/04* (2006.01)
*G01L 7/08* (2006.01)

(52) U.S. Cl.
USPC ............................................. 73/159; 73/715

(58) Field of Classification Search ............. 73/700–756
See application file for complete search history.

(56) References Cited

U.S. PATENT DOCUMENTS

| 4,960,177 A | 10/1990 | Holm-Kennedy et al. |
|---|---|---|
| 7,071,258 B1 | 7/2006 | Jang et al. |
| 7,086,288 B2 * | 8/2006 | Lee et al. ........................ 73/718 |
| 2003/0132376 A1 | 7/2003 | Bonnell et al. |

(Continued)

FOREIGN PATENT DOCUMENTS
WO WO-2010017409 A1 2/2010

OTHER PUBLICATIONS

International Application Serial No. PCT/US09/53033, International Search Report mailed Oct. 8, 2009, 4 pgs.
International Application Serial No. PCT/US09/53033, Written Opinion mailed Oct. 8, 2009, 8 pgs.

(Continued)

*Primary Examiner* — Andre Allen
(74) *Attorney, Agent, or Firm* — Schwegman Lundberg Woessner P.A.

(57) ABSTRACT

Force, pressure, or stiffness measurement or calibration can be provided, such as by using a graphene or other sheet membrane, which can provide a specified number of monolayers suspended over a substantially circular well. In an example, the apparatus can include a substrate, including a substantially circular well. A deformable sheet membrane can be suspended over the well. The membrane can be configured to include a specified integer number of one or more monolayers. A storage medium can comprise accompanying information about the suspended membrane or the substrate that, with a deflection displacement response of the suspended membrane to an applied force or pressure, provides a measurement of the applied force or pressure.

23 Claims, 8 Drawing Sheets

U.S. PATENT DOCUMENTS

| | | |
|---|---|---|
| 2006/0073712 A1 | 4/2006 | Suhir |
| 2007/0089496 A1 | 4/2007 | Degertekin |
| 2007/0151348 A1 | 7/2007 | Zdeblick et al. |
| 2008/0022778 A1 | 1/2008 | Liu et al. |
| 2008/0041164 A1* | 2/2008 | Cottles et al. ................... 73/726 |
| 2008/0096293 A1 | 4/2008 | Suhir et al. |
| 2010/0005851 A1* | 1/2010 | Cottles et al. .................. 73/1.57 |

OTHER PUBLICATIONS

Frank, I. W., et al., "Mechanical properties of suspended graphene sheets", J. Vac. Sci. Technol. B., 25(6), (2007), 2558-2561.

Lee, C., et al., "Measurement of the Elastic Properties and Intrinsic Strength of Monolayer Graphene", Science, 321, (2008), 385-388.

\* cited by examiner

US 8,418,547 B2

FORCE, PRESSURE, OR STIFFNESS MEASUREMENT OR CALIBRATION USING GRAPHENE OR OTHER SHEET MEMBRANE

CLAIM OF PRIORITY

This application is a nationalization under 35 U.S.C. 371 of PCT/US2009/053033, filed Aug. 6, 2009, and published as WO 2010/017409 A1 on Feb. 11, 2010, which claims priority to U.S. Provisional Patent Application Ser. No. 61/188,212, entitled FORCE, PRESSURE, OR STIFFNESS MEASUREMENT OR CALIBRATION USING GRAPHENE OR OTHER SHEET MEMBRANE, filed Aug. 7, 2008, which applications and publication are hereby incorporated by reference in their entirety, including its description of force, pressure, or stiffness measurement or calibration using graphene or other sheet membrane, and the benefit of priority of each of which is claimed.

STATEMENT REGARDING FEDERALLY SPONSORED RESEARCH OR DEVELOPMENT

This invention was made:

(A) with government support under award number CHE-0117752, CMMI-0500239, and DMR-0650555 from the National Science Foundation (NSF);

(B) with government support under award number HR0011-06-1-0214 from iMINT (DARPA Center on Nanoscale science and Technology for Integrated Micro/Nano-Electromechanical Transducers);

(C) with government support under award number FA9550-06-1-0214 from the U.S. Air Force Office of Scientific Research;

(D) using shared experimental facilities supported by the government under award number DMR-0213574 of the Materials Research Science and Engineering Center Program of the NSF; and (E) using the Cornell Nanoscale Science and Technology Facility, a member of the National Nanotechnology Infrastructure Network, with is supported under award number ECS-03357656 from the NSR.

The government has certain rights in this invention.

BACKGROUND

Graphene can be described as a two-dimensional sheet of covalently-bonded carbon atoms. Graphene forms the basis of both three-dimensional graphite and one-dimensional carbon nanotubes. Its intrinsic strength is useful in various materials, such as in carbon fiber reinforcements in advanced composites.

Overview

This document describes, among other things, a device that can be used for calibrating a nanomechanical force or displacement transducer. (1) and (2) describe measurements of mechanical properties of a graphene monolayer, such as can be suspended above a circular well in a silicon or other substrate. To measure such mechanical properties, one can use an atomic force microscope (AFM) probe or other nanoindenter. The AFM or other nanoindenter, in turn, can be calibrated, such as by using a calibration standard. For example, the calibration standard can take the form of a cantilever beam, such as can bend by a certain amount in response to a certain applied force.

The present inventors have also recognized, among other things, that having determined the mechanical properties of such suspended graphene monolayers, the force-displacement response of such a suspended graphene monolayer (e.g., such as shown and described in (1) and (2)) or other two-dimensional monolayer can also be used in a useful device, such as in as a calibration standard, such as for an AFM probe, nanoindenter, or the like. In a further example, the calibration standard can include a specified (e.g., integer) number of graphene monolayers (e.g., 1, 2, 3, . . . , etc.), such as to obtain a desired stiffness range.

Example 1 describes an apparatus. In this example, the apparatus can include a substrate, including a substantially circular well, and a deformable graphene or other two-dimensional (2D) sheet membrane, suspended over the well, the membrane including a specified integer number of monolayers.

In Example 2, the apparatus of Example 1 can optionally comprise accompanying information about at least one of a diameter of the well or a tension of the membrane.

In Example 3, the apparatus of one or more of Examples 1-2 can optionally be configured such that the accompanying information is provided in written form in a kit with the substrate and the membrane.

In Example 4, the apparatus of one or more of Examples 1-3 can optionally be configured such that the accompanying information is provided in stored electronic form.

In Example 5, the apparatus of one or more of Examples 1-4 can optionally be configured such that the accompanying information is provided in stored electronic form in a kit with the substrate and the membrane.

In Example 6, the apparatus of one or more of Examples 1-5 can optionally comprise a transducer configured to transduce a deflection of the membrane.

In Example 7, the apparatus of one or more of Examples 1-6 can optionally comprise a plurality of wells and corresponding suspended membranes.

Example 8 describes a method. In this example, the method can comprise using a substrate including a substantially circular well, using a deformable graphene or other two-dimensional (2D) sheet membrane that is suspended over the well, the membrane including a specified integer number of monolayers, and calibrating a transducer using a force-response of the membrane.

In Example 9, the method of Example 8 can optionally comprise using measured information about a diameter of the well in performing the calibrating.

In Example 10, the method of one or more of Examples 8-9 can optionally comprise using measured information about a tension of the membrane in performing the calibrating.

In Example 11, the method of one or more of Examples 8-10 can optionally comprise using measured information about the tension of the membrane in performing the calibrating, wherein the measured information is obtained using x-ray diffraction.

In Example 12, the method of one or more of Examples 8-11 can optionally comprise using measured information about the tension of the membrane in performing the calibrating, wherein the measured information is obtained using Raman spectroscopy.

Example 13 describes a method. In this example, the method comprises using a substrate including a substantially circular well, using a deformable graphene or other two-dimensional (2D) sheet membrane that is suspended over the well, the membrane including a specified integer number of monolayers, measuring a deflection of the membrane, and providing information about the deflection to a user or automated process.

Example 14 describes a method. In this example, the method includes providing a substrate including a substantially circular well, providing a deformable graphene or other two-dimensional (2D) sheet membrane that is suspended over the well, the membrane including a specified integer number of monolayers, measuring at least one of a diameter of the well or a tension of the membrane, and providing a user or automated process with information about at least one of the diameter of the well or a tension of the membrane.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

The patent or application file may contain at least one drawing executed in color. Copies of this patent or patent application publication with color drawing(s) will be provided by the Office upon request and payment of the necessary fee.

FIG. 1A is an example of a scanning electron micrograph (SEM) of a large graphene flake spanning an array of circular holes 1 μm and 1.5 μm in diameter, Area I shows an example of a hole partially covered by graphene, area II is fully covered, and area III is fractured from indentation. Scale bar, 3 μm.

FIG. 1B is an example of a non-contact mode AFM image of one membrane, 1.5 μm in diameter. The solid blue line is a height profile along the dashed line. The step height at the edge of the membrane is about 2.5 nm.

FIG. 1C is an example of a schematic of nanoindentation on suspended graphene membrane.

FIG. 3A is an example of a histogram of elastic stiffness. FIG. 3B is an example of a histogram of film pre-tensions. Dashed lines in both plots represent Gaussian fits to data. The effective Young's modulus and pre-stress were obtained, in an example, by dividing by the graphite interlayer spacing.

FIG. 4A shows an example of four typical tests, with different tip radii and film diameters; fracture loads are indicated by x marks. Breaking force depended strongly on tip radius but not on sample diameter. FIG. 4B shows an example of histogram and Gaussian distribution of breaking force for both tips.

FIG. 5A shows an example of graphene layer identification using optical microscopy. FIG. 5B shows an example of graphene layer identification using Raman spectroscopy at 633 nm. The flakes marked I, II, and III include one, two, and three atomic sheets, respectively.

DETAILED DESCRIPTION

Figure 1A:
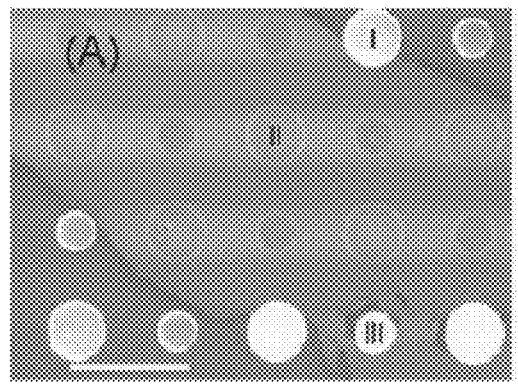
FIGS. 1A, 1B, and 1C show an example of images of suspended graphene membranes.
Figure 1B:
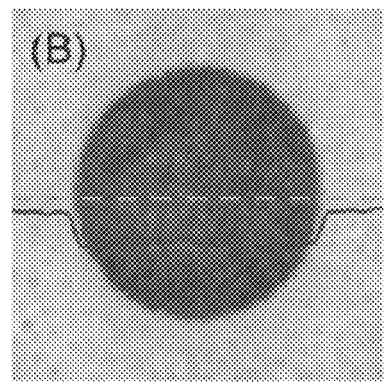

This patent application incorporates herein (both bodily and by reference) the following documents:
(1) Changgu Lee, Xiaoding Wei, Jeffrey W. Kysar, and James Hone, "Measurement of the Elastic Properties and Intrinsic Strength of Monolayer Graphene," Science, Vol. 321, 18 Jul. 2008; and
(2) Supporting Online Material for (1), above, found at <www.sciencemag.org/cgi/content/full/321/5887/385/DC1>.

This patent application describes, among other things, a device that can be used for calibrating a nanomechanical force or displacement transducer. Documents (1) and (2) describe measurements of mechanical properties of a graphene monolayer, such as can be suspended above a circular well in a silicon or other substrate. To measure such mechanical properties of a graphene monolayer, one can use an atomic force microscope (AFM) probe, such as in an nanoindenter mode, or one can use another nanoindenter. Some illustrative examples of other nanoindenters can include available nanoindenters, such as from Hysitron, Inc. (Minneapolis, Minn.), Agilent Technologies, Inc. (Santa Clara, Calif.), MTS Systems Corp. (Eden Prairie, Minn.), or CSM Instruments (Needham, Mass.), and such other nanoindenters can use different operating principles, such as to obtain a force or displacement measurement, such as for nanomechanical purposes. The AFM or other nanoindenter, in turn, can be calibrated, such as by using a calibration standard. For example, the calibration standard can take the form of a cantilever beam, such as can bend by a certain amount in response to a certain applied force, which can be used to provide calibration of the AFM or other nanoindenter.

The present inventors have also recognized, among other things, that having determined the mechanical properties of such suspended graphene monolayers, the force-displacement response of such a suspended graphene monolayer (e.g., such as shown and described in (1) and (2)) or other suspended two-dimensional monolayer can also be used in a useful device, such as in as a calibration standard, such as for calibrating an AFM probe, nanoindenter, or the like. In a further example, the calibration standard can include a specified (e.g., integer) number of graphene monolayers (e.g., 1, 2, 3, . . . , etc.), such as can be stacked or otherwise configured together to obtain a desired stiffness range.

Since the force-displacement response of the one or more suspended graphene monolayers can be affected by the diameter of the circular well in the substrate, such as shown and described in (1) and (2), it can be useful to know the diameter of the circular well in the substrate, for example, by measuring the diameter of the circular well using one or more techniques that provide good precision. In an example, a scanning electron microscopy (SEM) or atomic force microscopy (AFM) can be used for measuring the diameter of the well. It is believed that the AFM would probably have less uncertainty in the measurement, since the displacement measurement for AFM can be directly calibrated, such as via laser interferometry.

Since the force-displacement response of the one or more suspended graphene monolayers can be affected by the pre-tension of the one or more suspended graphene monolayers, such as shown and described in (1) and (2), it can be useful to know the amount of pre-tension in the one or more suspended graphene monolayers, for example, by measuring the pre-tension. In an example, the amount of pre-tension can be measured in one or more ways, such as by using one or any combination of glancing angle x-ray diffraction, Raman spectroscopy, or another technique. In an example, once the uncertainty in the measurement of the Young's modulus (E) of the graphene has been reduced, the result of a force-displacement measurement on a graphene film can be used to very accurately characterize the residual pre-tension, such as based upon curve-fitting the data to a rigorous equation.

In an example, when the well diameter and the pre-tension are measured or otherwise characterized, the force-displacement (e.g., stiffness) response of the one or more suspended graphene monolayers can be well-characterized theoretically or experimentally, or both. This permits one or more such structures including one or more such graphene monolayers to be used as a calibration standard, or other device for measuring or calibrating force, pressure, or stiffness. In an example, such a calibration standard can be used to calibrate an AFM probe, nanoindenter, or other nanomechanical force or displacement transducer.

Another approach to providing a calibration standard is to provide, as the calibration standard, a microscale cantilever beam that has a characterized stiffness. Such a microscale cantilever beam calibration standard can be used to calibrate the force and displacement measurements of an AFM, nanoindenter, or the like. Such microscale cantilever beams are typically fabricated from a material such as silicon. The mechanical stiffness of the cantilever beam calibration standard relies on the dimensions of the cantilever beam as well as the crystallographic orientation and the material properties of material from which it is fabricated. The uncertainty in the mechanical stiffness of the microscale cantilever beam (which is an important parameter for a calibration standard) then increases with uncertainty in any one or more of these variables.

By contrast, the present approach can use as the calibration standard a specified integer number of layers of graphene that are suspended over a circular well on a substrate. Since there are an integer number of graphene layers, the uncertainty in the thickness of the calibration standard can be reduced to zero. Likewise, since the suspended graphene film can be suspended from a substantially circular well, the present approach does not suffer from the cantilever beam calibration standard approach's uncertainty in the crystallographic orientation of the device. Instead, in the present approach, the stiffness of the one or more suspended graphene layers can be a function of the mechanical properties of the graphene, the pre-tension in the suspended graphene film or membrane (such as from fabrication), and the diameter of the circular well. In principle, there is no variation in the mechanical properties of the graphene layers. Therefore, the only uncertainty in the calibration standard can come from uncertainty in the size of the circular well and the pre-tension—each of which can be measured, and the resulting measurement information can be provided in correspondence with the well being used as the calibration standard (e.g., in written form, as electronically-stored data in an accompanying non-volatile memory device, or in any other way).

Thus, the present approach, unlike the cantilever beam calibration standard approach, can provide an "intrinsic" calibration standard, in the sense that there should be no variation in the mechanical properties of the graphene from one fabricated calibration standard to the next.

The present approach can also be used to calibrate a force or pressure transducer—or even to implement a force or pressure transducer, such as in an example in which the amount of deflection of the graphene film can be measured. When a force or pressure is applied to the suspended graphene film, the amount of deflection of the graphene will be related to the applied force or pressure. The measured amount of deflection of the graphene can be used to provide a sensed indication of the applied force or pressure.

In an example, measuring the pre-tensioning in the suspended graphene sheet can be avoided, such as by fitting data to the cubic part of the model shown and described in (1) and (2). In a further example, the force-displacement response of the graphene sheet at high displacements can be independent enough from the degree of pre-tension, that a robust calibration standard can be provided without requiring any measuring of the pre-tension, and without requiring any fitting data to the cubic part of the model shown and described in (1) and (2).

The above description has emphasized examples using one or more suspended graphene monolayers as the membrane or film, since that is what has been primarily explored experimentally by the present inventors, as shown and described in (1) and (2). Graphene is a molecule that can adopt a two-dimensional (2D) sheet-like configuration, such as in which the extent of the 2D sheet can, in principle, be unlimited (e.g., the area of the sheet can be as large as desired, or as large as can be practically fabricated). By contrast, deoxyribonucleic acid (DNA) can be conceptualized as a substantially one-dimensional (1D) molecule that can be as long as desired or as can be practically fabricated. Thus, the present inventors also recognize that one or more other two-dimensional (2D) monolayers can similarly be characterized and used, such as to provide a calibration standard. In an illustrative example, a suspended membrane or film comprising or consisting of graphene oxide can be used, such as in one or more 2D monolayers suspended over the well in the substrate.

Different suspended film or membrane materials can provide different force-displacement responses, such that a particular film or membrane material can potentially be well suited for a particular stiffness (e.g., force vs. displacement range) or range of stiffnesses. As described above, graphene can be obtained or provided in multiple (e.g., specified integer) monolayer thicknesses. Some other materials, however, may not be "stackable" to obtain multiple (e.g., specified integer) monolayer thicknesses. However, a single monolayer of such a material can still be used in the manner described herein.

Figure 13:
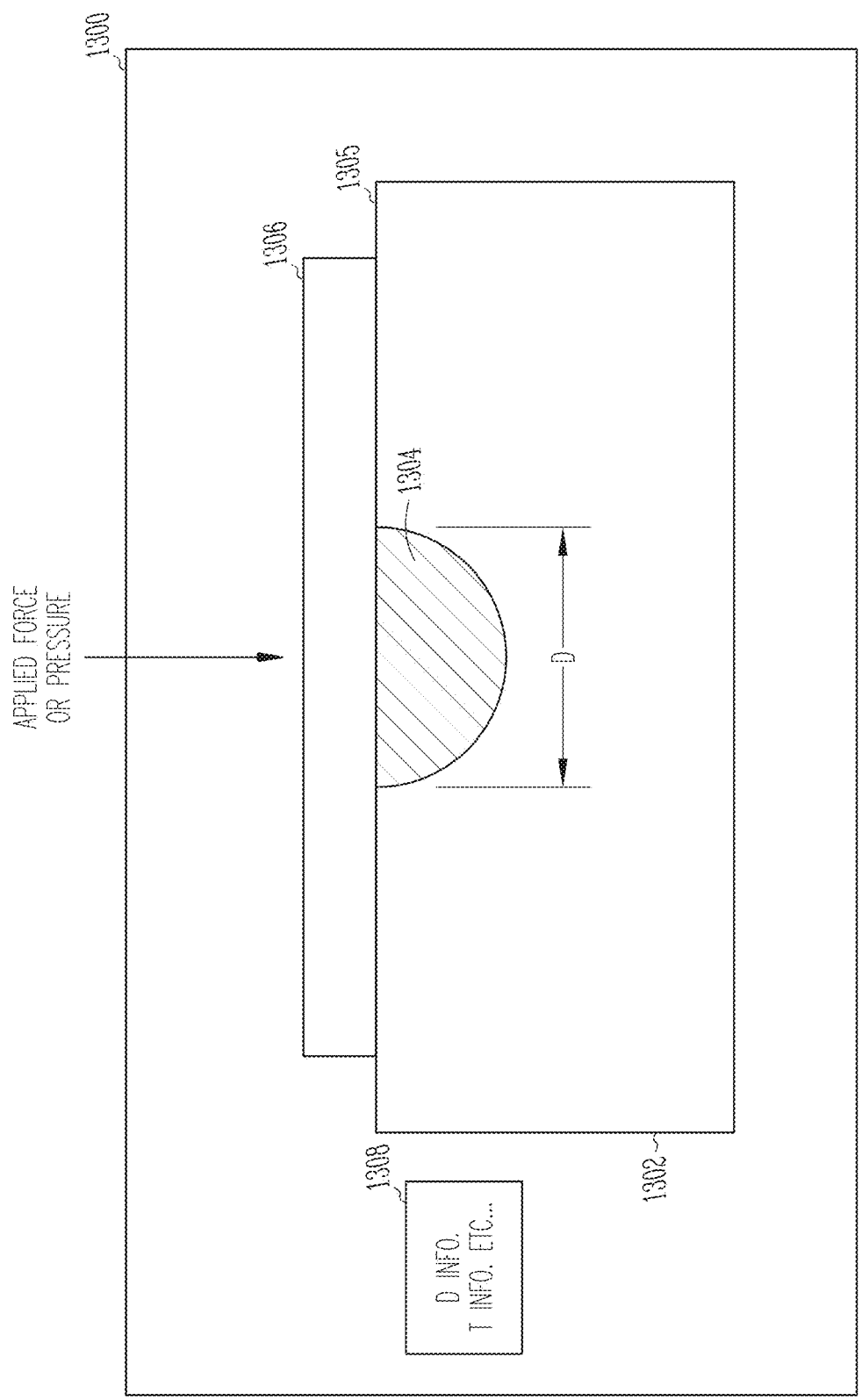
FIG. 13 shows an example of an assembly or kit including a substrate, a membrane with a specified integer number of monolayers disposed over a well in the substrate, and a storage medium including information about the substrate or the membrane.

FIG. 13 is a schematic diagram showing an example of an assembly or kit 1300. In an example, the kit 1300 can include a substrate 1302, such as described herein. In an example, the substrate 1302 can include a well 1304 or recess, or a plurality thereof. In an example, the well 1304 can be substantially circular at a working (e.g., top) surface 1305 of the substrate 1302. In an example, a membrane 1306 comprising a specified integer number of one or more two-dimensional (2D) monolayers can be located on the working surface 1305 of the substrate 1302, such as to cover over the well 1304 or a plurality thereof. In an example, the membrane 1302 can include a specified number of graphene monolayer flakes, which can be stacked to provide the specified number of monolayers. Different flakes can also be used to cover over different wells 1304. In an example, the flakes can be secured to the substrate 1302, such that they can be approximated as substantially clamped to the working surface 1305 of the substrate 1302, such as about the circular periphery of the well 1304. An applied force or pressure, such as from an AFM or nanoindenter, can be received at or near a center of the circular well 1304, thereby deflecting the membrane 1306 downward into the well. The resulting deflection response can be measured, such as by using the AFM or the nanoindenter, or other transducer capable of measuring the displacement of the membrane 1306.

In an example, the kit 1300 also includes a tangible storage medium 1308, including information about the substrate 1302 or about the membrane 1306. In an example, this information can include one or more of: information about the pre-tensioning T of the membrane 1306 (such as can be obtained from previous measurements), information about the diameter D of the well 1304, information about the number of monolayers in the membrane 1306 suspended over a particular well 1304, or any combination thereof. In an example, the storage medium 1308 can include an accompanying pamphlet or similar written information that accompanies the substrate 1202 in the kit 1300. In an example, the storage medium 1308 can include electronic, optical, or other data storage, such as a non-volatile memory, for example, to store a digitally-encoded machine-readable representation of such information.

Figure 14:
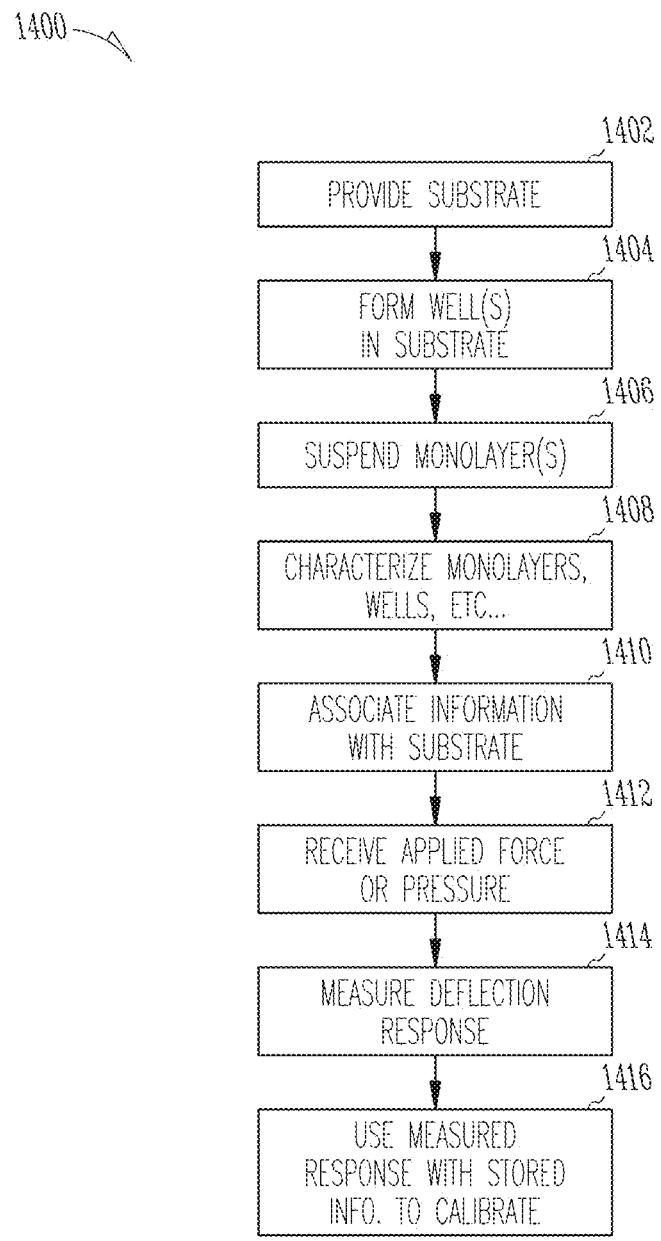
FIG. 14 shows an example of a method 1400, which can include acts for forming an apparatus such as shown in FIG. 13, for using such an apparatus, or both.

FIG. 14 shows an example of a method 1400, which can include acts for forming an apparatus such as shown in FIG. 13, for using such an apparatus, or both. At 1402, a substrate 1302 can be provided, such as described elsewhere herein. At 1404, one or more wells 1304 can be formed in the substrate, such as described elsewhere herein. At 1406, a specified number of one or more monolayers can form a membrane 1306, which can be suspended over one or more of the wells 1304, such as described elsewhere herein. In an example, multiple membranes can be variously disposed upon the substrate 1302, such as to cover different wells 1304, such as described elsewhere herein. At 1408, a particular well 1304 or its covering membrane 1306 can be characterized (e.g., number of monolayers, amount of pre-tension, well-diameter, etc.), such as described elsewhere herein. Such characterization can be carried out individually for the different wells 1304, if desired. At 1410, the characterizing information can be associated with the substrate 1302, together providing a kit 1300. This can include providing the characterizing information in an accompanying storage medium 1308, whether in human-readable written form, machine-readable electronic form, etc. In an example, the storage medium 1308 can be integrated onto the substrate 1302 or packaged together with the substrate 1302, if desired. At 1412, the kit 1300 can be used, such as by receiving an applied force or pressure, such as from an AFM or nanoindenter, such as described elsewhere herein. At 1414, a deflection response of the membrane 1306 to the applied force or pressure can be measured. In an example, such measurement can be obtained using the AFM or nanoindenter providing the applied force or pressure. In an example, such measurement can be obtained using a different transducer, which can be integrated or packaged with the substrate 1302, if desired. In an example, the measured deflection response can include a resulting displacement of the center of the membrane 1306 down into the well 1304. At 1416, the measured deflection response of the membrane 1306 is used, such as together with some or all the accompanying information stored in the storage medium 1308 for the particular well 1304, to calibrate a device. In an example, the device being calibrated is the AFM or nanoindenter that provided the applied force or pressure.

APPENDIX 1

Measurement of the Elastic Properties and Intrinsic Strength of Monolayer Graphene In an example, we measured the elastic properties and intrinsic breaking strength of free-standing monolayer graphene membranes by nanoindentation with an atomic force microscope. The force-displacement behavior can be interpreted within a framework of nonlinear elastic stress-strain response and, in an example, yields second- and third-order elastic stiffnesses of 340 Newtons per meter (N m$^{-1}$) and −690 N m$^{-1}$, respectively. The breaking strength is 42 N m$^{-1}$, in an example, and represents the intrinsic strength of a defect-free sheet. These quantities correspond to a Young's modulus of E=1.0 terapascals, third-order elastic stiffness of D=−2.0 terapascals, and intrinsic strength of $\sigma_{int}$=130 gigapascals for bulk graphite. In light of these experiments, it is believed that graphene is the strongest material ever measured. These experiments also show that atomically perfect nanoscale materials can be mechanically tested, such as to deformations well beyond the linear regime.

In 1921, Griffith published a groundbreaking study on the fracture of brittle materials that established the relationship between the change of potential energy of a brittle system with crack growth and the free energy of a newly created surface. As a result of this insight, Griffith deduced that the actual breaking strength of a brittle material is governed by the sizes of defects and flaws within the material, rather than the intrinsic strength of its atomic bonds. To emphasize the point, Griffith wrote that "in the limit, in fact, a fiber consisting of a single line of molecules must possess the theoretical molecular tensile strength," the maximum stress that can be supported by the material before failure, in a pristine material without defects, here denoted as the intrinsic strength. He then proceeded to experimentally estimate the intrinsic tensile strength by measuring the breaking strength of a series of glass fibers with progressively smaller diameters and extrapolating the results to an atomic radius. He extrapolated an intrinsic strength of about E/9, where E is the elastic stiffness (Young's modulus) of the material under uniaxial tension. In the intervening decades, a direct and repeatable measurement of the intrinsic breaking strength of a material has remained elusive. We probed the intrinsic strength of monolayer graphene, in an example, as well as its linear and nonlinear elastic properties.

Graphene, which includes a two-dimensional (2D) sheet of covalently bonded carbon atoms, forms the basis of both three-dimensional (3D) graphite and one-dimensional (1D) carbon nanotubes. Its intrinsic strength, predicted to exceed that of any other material, can be useful such as to provide carbon-fiber reinforcements in advanced composites, for example, it may permit such exotic structures as a "space elevator" if macroscopic fibers close to the theoretical strength can be fabricated. However, the intrinsic strength of this material is difficult to measure because of the inevitable presence of defects and grain boundaries in macroscopic samples. Studies of carbon nanotubes can confirm their high stiffness and strength. However, determination of these quantities is difficult, for example, because of uncertainty in the sample geometry, stress concentration at clamping points, structural defects, or unknown load distribution among shells in multi-walled nanotubes, among other things. Individual graphene sheets can now be studied. In an example, we used atomic force microscope (AFM) nanoindentation to measure the mechanical properties of monolayer graphene membranes suspended over open holes. This technique can also be used to study multilayer graphene and can offer advantages over experiments on nanotubes. For example, the sample geometry can be precisely defined, the 2D structure can be less sensitive to the presence of a single defect, and the sheet can be clamped or otherwise secured around the entire hole circumference, as opposed to being secured at two points, such as in the case of nanotubes.

In an example, a 5-by-5-mm array of circular wells (e.g., diameters 1.5 μm and 1 μm, depth 500 nm) was patterned onto a substrate (e.g., Si), such as with a 300-nm $SiO_2$ epi-layer, such as by nanoimprint lithography and reactive ion etching, such as shown in the example of FIG. 1. Graphite flakes were then mechanically deposited onto the substrate, in an example. Optical microscopy was used to find flakes of monolayer graphene, the thicknesses of which were confirmed with Raman spectroscopy. FIG. 1A shows an example of a monolayer flake that can be deposited over one or many circular wells, such as to form one or more free-standing membranes. FIG. 1B shows an example in which non-contact mode AFM imaging confirmed that these examples of graphene membranes were stretched tautly across the well openings. It also revealed that the graphene can adhere to the vertical wall of the hole for 2 to about 10 nm, believed to be because of van der Waals attraction to the substrate.

Figure 1C:
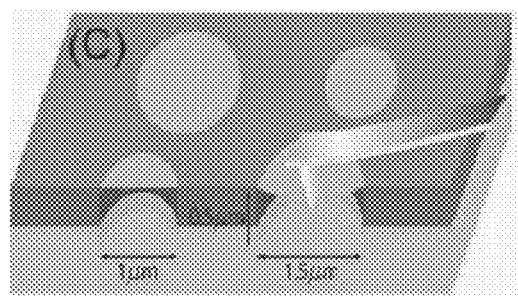

In an example, the mechanical properties of the free-standing films were probed, such as by indenting the center of each film with an AFM (e.g., XE-100, Park Systems), such as illustrated in FIG. 1C. Because of the strength of the film, cantilevers with diamond tips were used for this study. Two different cantilevers were used, e.g., with tip radii of 27.5 nm and 16.5 nm, respectively, as measured before and after indentation via transmission electron micrography (TEM). In an example, the corresponding cantilever spring constants were calibrated against a reference cantilever. Before indenting, the graphene membranes were scanned in a noncontact AFM mode, in an example, and the AFM tip was subsequently positioned to within 50 nm of the center of the suspended film. In an example, mechanical testing was performed at a constant displacement rate, followed by load reversal. This cycle was repeated several times for each film tested. The data showed no hysteresis, which demonstrated the elastic behavior of the film and showed that the graphene film did not slip around the periphery of the well. The force vs. displacement measurements were highly repeatable; in an example, data sets from different flakes, membrane diameters, displacement rates, and indenter tip radii yielded values of the elastic modulus that were statistically indistinguishable. Once the data for elastic properties of the films were recorded, the films were once again indented at the same rate—but this time to failure. In an example, the force-displacement data were processed to determine the elastic properties and breaking stress of the graphene membranes.

The elastic response of the graphene can be considered nonlinear because the stress-strain response curves over to a maximum point that defines the intrinsic breaking stress. An elastic (e.g., reversible) response indicates the existence of an energy potential that is a function of strain that can be expressed as a Taylor series in powers of strain. The lowest-order (e.g., quadratic) term leads to a linear elastic response. The third-order term gives rise to nonlinear elastic behavior. The resulting isotropic elastic response under uniaxial extension can be expressed as $$\sigma = E\epsilon + D\epsilon^2 \tag{1}$$

where $\sigma$ is the symmetric second Piola-Kirchhoff stress, $\epsilon$ is the uniaxial Lagrangian strain, E is the Young's modulus, and D is the third-order elastic modulus. The value of D is typically negative, so the presence of the second-order term leads to a lessening of stiffness at high tensile strains and an increasingly stiff response at high compressive strains. In an example, E was determined from components of the second-order fourth-rank stiffness tensor (with two independent components for an isotropic material), whereas D was determined from components of both the second-order fourth-rank stiffness tensor and the third-order sixth-rank stiffness tensor (with three independent components for an isotropic material). Numerical simulations of graphene sheets and nanotubes indicate that a nonlinear elastic response is appropriate.

This thermodynamically rigorous nonlinear form of the stress-strain response should capture the salient features of the elastic behavior of graphene. The maximum of the elastic stress-strain response defines the intrinsic stress, which for this functional form is $\sigma_{int} = -E^2/4D$ at the strain $\epsilon_{int} = -E/2D$, and E and D can be determined from the experimental results. In an example, we determined the value of E based on the experimental force-displacement data and the value of D from the experimental breaking force.

Monolayer graphene is a true 2D material, so its strain energy density is normalized by the area of the graphene sheet rather than by the volume. Therefore, its behavior under tensile loading can be properly described by a 2D stress $\sigma^{2D}$ and elastic constants $E^{2D}$ and $D^{2D}$ with units of force/length. The equations given above are believed valid for any dimensionality. For purposes of comparison to bulk graphite and other materials, these quantities can be divided by the interlayer spacing in graphite (e.g., h=0.335 nm) in order to obtain the corresponding 3D parameters. However, the derived quantities are not intrinsic properties of the single sheet and are not used to predict other mechanical properties, such as bending stiffness.

Even at the maximum curvatures present in these experimental examples, the energy from bending the graphene membrane is three orders of magnitude smaller than the energy from in-plane strain, using ab initio values for the in-plane stiffness and flexural rigidity. Therefore, in an example, the graphene can be modeled as a 2D membrane (e.g., it has zero bending stiffness). In an example, we performed detailed finite-element analyses for this geometry and loading based on the constitutive relations in Eq. 1, using various values of $D^{2D}$, tip radius, and indenter position. Three noteworthy points emerged from this analysis. First, the resulting force-displacement curve made by using the nonlinear elastic model was virtually indistinguishable from that of the linear model (where $D^{2D}=0$). The calculated radial stress distribution and shape of the deformed film show why, in an example, nonlinear effects can be ignored while simulating the force-displacement response. Even close to breaking, at most 1% of the graphene film is strained to the point where the nonlinear term in Eq. 1 becomes appreciable. Second, the simulations demonstrated that the force-displacement curve is insensitive to the indenter tip radius when R<<a, where R is the tip radius and a is the membrane diameter. Third, the force-displacement response is insensitive to the position of the tip (to within experimental uncertainty) if the indenter tip is located within a/10 of the center of the film. Therefore, in an example, for the purposes of modeling the force-displacement behavior, the system can be approximated as a clamped circular membrane, made of a linear isotropic elastic material, under central point loading. Isotropic mechanical properties can be used because the graphene atomic lattice has sixfold rotation symmetry.

Figure 2A:
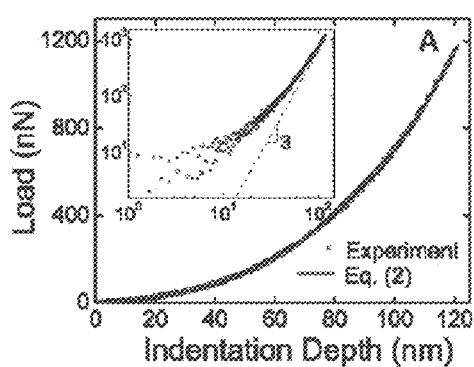
FIG. 2A is an example of a loading/unloading curve and curve fitting to Eq. 2. In an example, the curve approaches cubic behavior at high loads (inset).

Given the above model, the force-displacement behavior can be approximated as $$F = \sigma_0^{2D}(\pi a)\left(\frac{\delta}{a}\right) + E^{2D}(q^3 a)\left(\frac{\delta}{a}\right)^3 \quad (2)$$

where F is applied force, $\delta$ is the deflection at the center point, $\sigma_0^{2D}$ is the pre-tension in the film, $\nu$ is Poisson's ratio (e.g., taken here as 0.165, the Poisson's ratio for graphite in the basal plane), and $q=1/(1.05-0.15\nu-0.16\nu^2)=1.02$ is a dimensionless constant. The solid line in FIG. 2A shows an example of the least-squares curve fit of one set of experimental data, based on Eq. 2, taking $\sigma_0^{2D}$ and $E^{2D}$ as free parameters. The closeness of the fit further validates the appropriateness of this model.

Figures 3A, 3B:
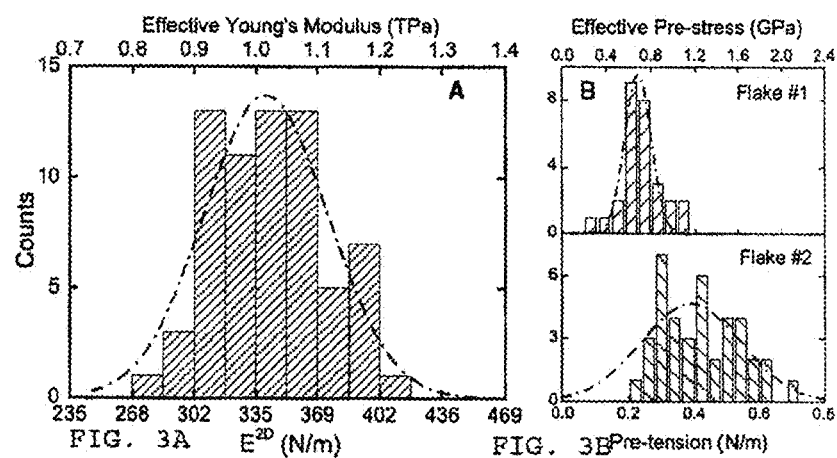
FIGS. 3A and 3B show an example of elastic response test results.

In an example, for this study, membranes from two separate graphene flakes were tested. These included seven with 1 µm diameters and six with 1.5 µm diameters from flake 1, and five of each size from flake 2. In an example, each flake was probed using a different cantilever. For each membrane, approximately three loading/unloading curves were collected, in an example, to multiple depths (e.g., between 20 and 100 nm). In total, 67 values of $\sigma_0^{2D}$ and $E^{2D}$ were determined by fitting to Eq. 2. FIG. 3A shows an example of the distribution of the derived values of $E^{2D}$. The mean value of $E^{2D}$ is 342 N m$^{-1}$, with a standard deviation of 30 N m$^{-1}$. The elastic modulus values obtained from all data subsets (e.g., different flakes, tips, well radii, indentation depth, or indentation speed) were statistically indistinguishable.

FIG. 3B shows an example of the derived values for the film pre-tension, which range from 0.07 to 0.74 N m$^{-1}$, with flake 2 showing larger pre-tension on average. These values are remarkably high—higher than the fracture strengths of many conventional materials. In an example, we also observed that, because the membrane follows the wall for 2 to 10 nm, the actual membrane profile can be about 2% to 1% longer than the nominal well diameter. This elongation would lead to an added stress of 0.7 to 3.4 N m$^{-1}$, larger than the measured pre-tension in most cases. Therefore, we can conclude that the graphene is nominally in a compressed state when it is not suspended.

Figure 1D:
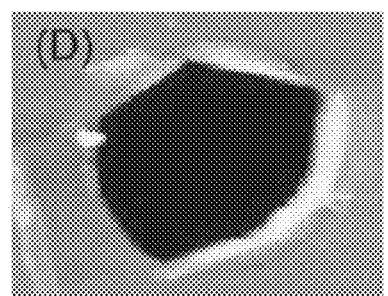
FIG. 1D is an example of an AFM image of a fractured membrane.
Figure 2B:
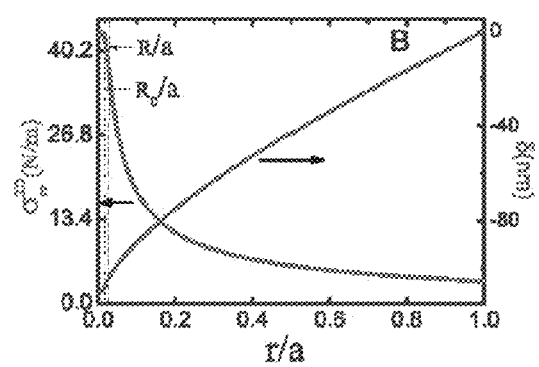
FIG. 2B is an example of Maximum stress and deflection of graphene membrane versus normalized radial distance at maximum loading (simulation based on nonlinear elastic behavior in Eq. 1. The dashed lines in this example indicate the tip radius R and contact radius $R_c$.
Figures 4A, 4B:
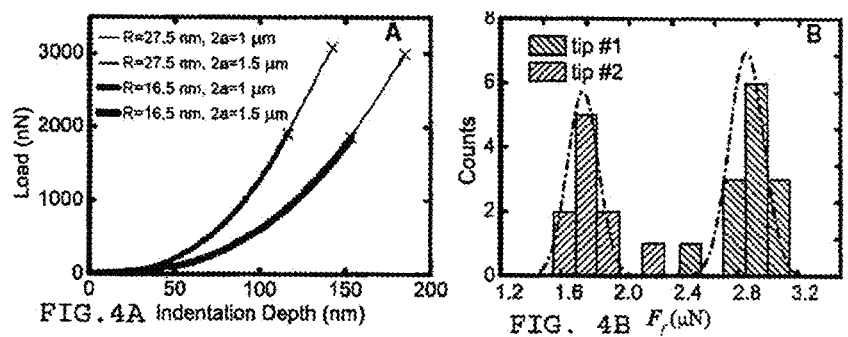
FIGS. 4A and 4B illustrate an example of fracture test results.

The intrinsic strength of graphene was measured by loading the membranes to the breaking point. FIG. 4A shows an example of four typical breaking curves, for both tip radii and well diameters. In this example, there is no sign of slippage or other irreversible deformation before catastrophic failure. FIG. 1D shows an example of an AFM image of a fractured membrane. In this example, the graphene film still hangs around the edge of the hole, which indicates that fracture started at the indentation point. The films can break at large deflections (e.g., above 100 nm) and forces of about 1.8 µN and 2.9 µN for the smaller and larger indenter tips, respectively. These forces were large enough to break standard Si AFM tips; TEM inspection confirmed that the diamond tips used in this study were not damaged. From those four curves, a clear pattern emerges: the force-displacement behavior is insensitive to tip radius, but the breaking force is mainly a function of tip radius and does not show dependence on membrane size, because of the extreme stress concentration (see also FIG. 2B) under the indenter tip.

In an example, the maximum stress for a clamped, linear elastic, circular membrane under a spherical indenter as a function of applied load can be derived on the basis of a continuum model as $$\sigma_{in}^{2D} = \left(\frac{FE^{2D}}{4\pi R}\right)^{\frac{1}{2}} \quad (3)$$

where $\sigma_{in}^{2D}$ is the maximum stress at the central point of the film. This analytical solution can help illuminate the relationship among breaking force, tip radius, and maximum stress, in particular showing that the breaking force should vary inversely with tip radius. Analyzing all of the measured data using Eq. 3 yields an average breaking strength of 55 N m$^{-1}$. However, because the model ignores nonlinear elasticity, this value can overestimate the strength.

The breaking forces we measured in the graphene films can suggest that the films in the neighborhood of the tip are free of defects, so that the maximum stress in the film represents the intrinsic strength. Two observations support this. First, the magnitude of the stresses under the indenter tip that we observed is consistent with predictions of intrinsic strength based on ab initio calculations for monolayer graphene. Second, the distribution of breaking forces, as shown in FIG. 4B, was relatively narrow, whereas for brittle fracture one may expect a wider distribution depending on the random size, number, and position of defects under the tip. The second can be quantified by fitting the histograms to the Weibull distribution, which can be used to characterize the failure of brittle materials with random defects. The statistics indicate that the material is defect-free, at least under the indenter tip. This is consistent with scanning tunneling microscopy measurements of graphene films (from the same source material) that show no defects over regions of hundreds of square nanometers. Therefore, in an example, we used a nonlinear elastic model to treat the breaking force data as corresponding to the intrinsic strength of the graphene.

In an example, a series of numerical simulations was performed for the 1-μm-diameter graphene film and the 16.5-nm-radius indenter tip to determine the relationship between the indentation breaking force and the third-order elastic constant, $D^{2D}$. In these simulation examples, the breaking force was determined as that load at which the solution could no longer converge to an equilibrium state under the indenter tip because of the negative slope of the elastic response at strains larger than $E_{int}$. The mean experimentally-determined breaking force of 1770 nN was consistent with a value of $D^{2D} = -690$ N m$^{-1}$. This value of $D^{2D}$ was then used in the numerical model for the 1-μm-diameter graphene film and the 27.5-nm-radius indenter. The simulation predicted a breaking force (2880 nN) virtually identical to the mean experimental value of 2890 nN. Therefore, the experimentally determined values of the second-order and third-order elastic stiffnesses for monolayer graphene are $E^{2D} = 340 \pm 50$ N m$^{-1}$ and $D^{2D} = -690 \pm 120$ N m$^{-1}$, respectively. The intrinsic strength is $\sigma_{int}^{2D} = 42 \pm 4$ N m$^{-1}$. These correspond to Young's modulus of $E = 1.0 \pm 0.1$ TPa and a third-order elastic stiffness of $D = -2.0 \pm 0.4$ TPa, assuming an effective graphene thickness of 0.335 nm. The corresponding intrinsic stress is $\sigma_{int} = 130 \pm 10$ GPa at a strain of $\epsilon_{int} = 0.25$. Also, $\sigma_{int} \approx E/8$.

The intrinsic strength described herein can serve as a benchmark for structural and mechanical applications, although the strength of macroscopic graphitic materials can still be limited by the presence of defects and grain boundaries. In addition, these measurements demonstrate that third-order elastic constants associated with nonlinear behavior can be measured in atomically perfect nanoscale materials. These measurements can be used to validate models of atomic potentials far beyond the linear regime.

APPENDIX 2

Measurement of the Elastic Properties and Intrinsic Strength of Monolayer Graphene Materials and Methods Preparation of Samples In an example, the substrate was fabricated using nanoimprint lithography and reactive ion etching (RIE). In an example, the nanoimprint master included a 5×5 mm array of circular features (e.g., 1 and 1.5 μm diameters), was fabricated by electron-beam lithography, and etched to a depth of 100 nm such as by using RIE, and coated with an anti-adhesion agent (e.g., NXT-110, Nanonex). In an example, the sample wafer (e.g., Si with a 300 nm SiO$_2$ epilayer) was coated with 10 nm Cr such as by thermal evaporation, followed by a 120 nm spin-coated PMMA layer. In an example, the imprint master was used to imprint the PMMA to a depth of 100 nm. In an example, the residual layer of the PMMA was etched in oxygen RIE, and the chromium layer was etched in a chromium etchant (e.g., Cr-7S, Cyantek) such as for 15 seconds. In an example, using the chromium as an etch mask, fluorine-based RIE was used to etch through the oxide and into the silicon such as to a total depth of 500 nm. In an example, the chromium layer was then removed.

Figures 5A, 5B:
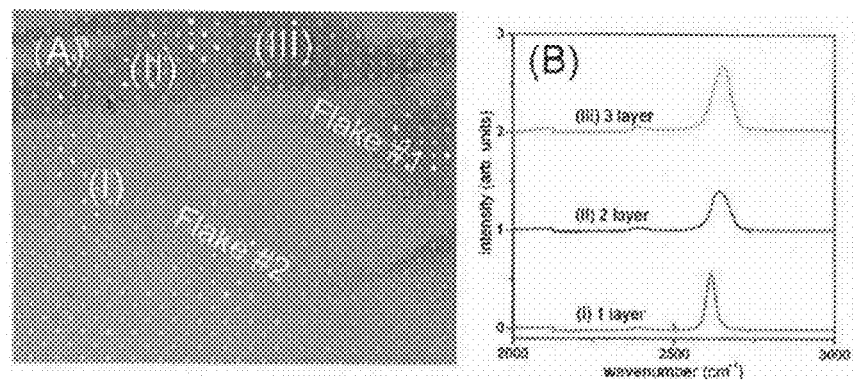
FIGS. 5A, 5B show an example of graphene layer identification.

In an example, graphene was deposited such as by mechanical cleavage and exfoliation. In an example, a small piece of Kish graphite (e.g., Toshiba Ceramics) was laid on Scotch tape, and thinned such as by folding repeatedly. In an example, the thinned graphite was pushed down onto the patterned substrate, rubbed gently, and then detached. In an example, the deposited flakes were examined with an optical microscope such as to identify candidate graphene flakes with very few atomic layers. In an example, the number of graphene layers was confirmed using Raman spectroscopy. FIG. 5 shows an example of an optical image of graphene layers and an example of the Raman spectra of the graphene layers. In an example, monolayer graphene flakes fabricated from the same graphite source can be characterized by similar procedures with scanning tunneling microscopy (STM), which can yield results showing the graphene flake to be defect-free over an area of 100×100 nm$^2$.

Characterization of AFM Tips and Cantilevers

Figures 6A, 6B, 6C:
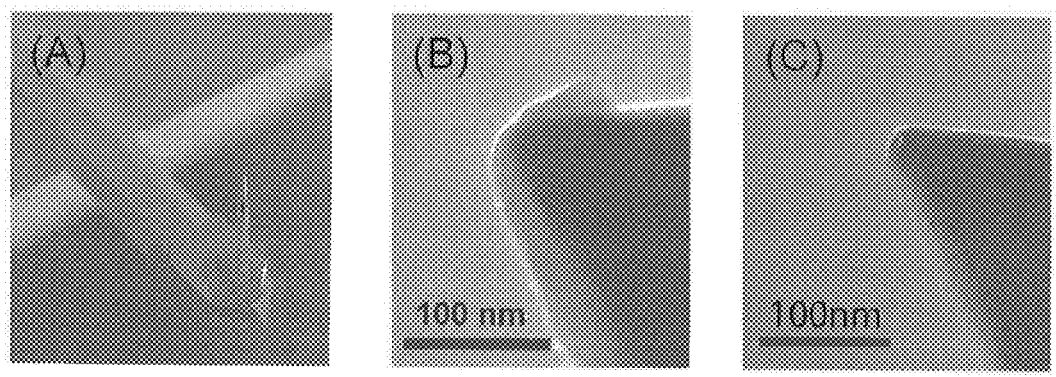
FIG. 6A shows an example of a scanning electron micrograph (SEM) of the cantilever and diamond stylus.
FIG. 6B shows an example of a transmission electron micrograph (TEM) of tip #1 after nanoindentation. In this example, the small flake at the end of the tip is a graphene piece from a broken membrane.
FIG. 6C shows an example of a transmission electron micrograph (TEM) of tip #2.

In an example, we found that standard silicon atomic force microscope (AFM) tips fractured at forces smaller than the breaking force of the suspended graphene membranes. Hence, in an example, diamond AFM tips manufactured by Namiki Co. (Japan) were used for the experiments. FIG. 6 shows an example of electron micrographs of both tips. In an example, the microfabricated diamond stylus is mounted on a Si cantilever (e.g., TL-NCH, Nanosensors). In an example, the length of the diamond stylus is about 60 μm, and the tip has a three-sided pyramidal shape with cone angle of 60 degrees. In an example, although the stylus is perpendicular to the cantilever, the angle of the pyramidal tip is tilted by 13 degrees, which compensates for the angle of the cantilever to the test sample when mounted on the AFM. In an example, the radii of curvature of tips 1 and 2 were 27.5 nm and 16.5 nm, respectively, according to measurement using transmission electron microscopy (TEM), such as shown in FIGS. 6B and 6C.

In an example, the AFM cantilever stiffness was calibrated using a reference cantilever with a specified stiffness (e.g., CLFC-NOMB, Veeco). In order to confirm the spring constant of the reference cantilever, the Sader method, which uses the cantilever dimensions, resonant frequency, and Q-factor was employed. The value supplied by the manufacturer (9.48 N/m) agreed well with the Sader method (9.37 N/m).

In an example, the spring constant of the test cantilever was calibrated by pushing against the reference cantilever and measuring the tip deflection as a function of piezoelectric transducer displacement $\delta_{piezo}$ such as by using $$K_{test} = K_{ref} \frac{\delta_{piezo} \delta_{test}}{\delta_{test} \cos\theta} \qquad \text{Eq. S1}$$

where $K_{ref}$ is the spring constant of the reference cantilever, $\delta_{test}$ is deflection of the test cantilever, and $\theta$ is the tilt angle of the test cantilever. The uncertainty of this method is believed to be within 9%. From this procedure, the force constants of the diamond-tip attached cantilevers were 44.8 and 58.8 N/m for tips 1 and 2, respectively.

Indentation Process

In an example, the nanoindentation experiments were performed with an AFM (e.g., XE-100, Park systems) mounted on a vibration isolation system (e.g., Minus K technology) for stable data acquisition. In order to reduce or minimize the thermal drift of the piezo actuators, in an example, the sample was scanned for more than two hours before indentation. For indentation, in an example, each membrane was scanned in non-contact mode to find the indentation position accurately. In an example, the geometric center of the membrane was chosen manually for indentation. In an example, the accuracy of positioning of the center is estimated to be within 50 nm considering the thermal drift (e.g., measured at 10 nm/min, with the indentation process time<5 min).

For this study, in an example, 23 membranes from two separate graphene flakes were tested. In an example, these included seven membranes with 1 μm diameter and six with 1.5 μm diameter from flake #1, and five of each size from flake #2. In an example, each flake was probed using a different cantilever. For each membrane, in an example, about three loading/unloading curves were collected in force/displacement spectroscopy mode, to multiple depths (e.g., between 20 and 100 nm). Overall, in an example, 67 data sets were obtained for Young's modulus and pre-tension calculations, and 23 data sets for ultimate strength calculation. In an example, the loading and unloading speed was 0.23 μm/s for flake #1 and 1.3 μm/s for flake #2. In an example, the force-displacement data for a few membranes showed non-trivial hysteresis that was accompanied by significant sliding of the graphene flake around the periphery of the well, as seen with the AFM. These data were not considered in analyses.

Data Processing

Figures 7A, 7B:
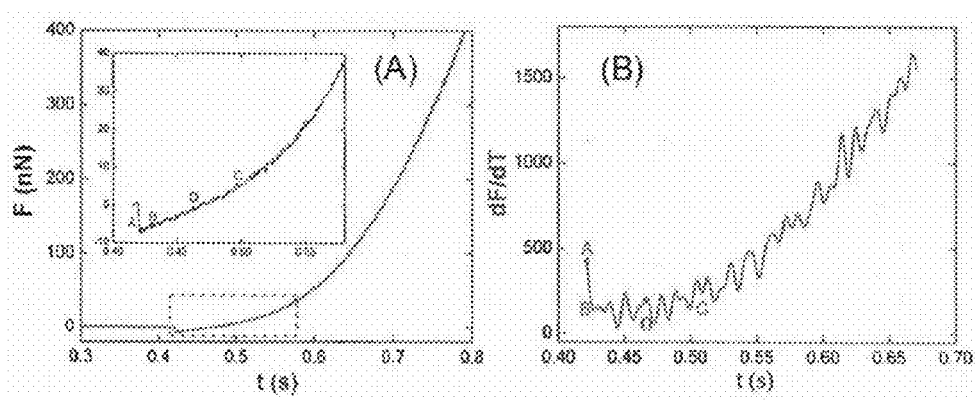
FIG. 7A shows an example of measured force vs. time for one indentation test. The inset shows the "snap-down" of the indenter tip.
FIG. 7B shows an example of a time-derivative of the measured force vs. time. In this example, points A, B, O, and C correspond to the same locations as in FIG. 7A.

FIG. 7A shows an example of the raw data from a typical test of monolayer graphene membrane. In an example, the indenter tip first snaps down (e.g., point A) to the graphene membrane, due to van der Waals attraction, then begins to deflect upward as the tip presses against the membrane. To obtain the correct force-displacement relationship, in an example, one can determine the point at which the force and displacement are both zero. Just beyond the snap-in point, the force-time curve shows linear behavior (between points B and C) in an example. The middle point, O, can be defined as the zero-displacement point at which the cantilever becomes straight and the membrane is flat. The derivative of the force as a function of time can then be calculated as in FIG. 7B; the point O is in the middle of the plateau of the derivative.

Figures 8A, 8B:
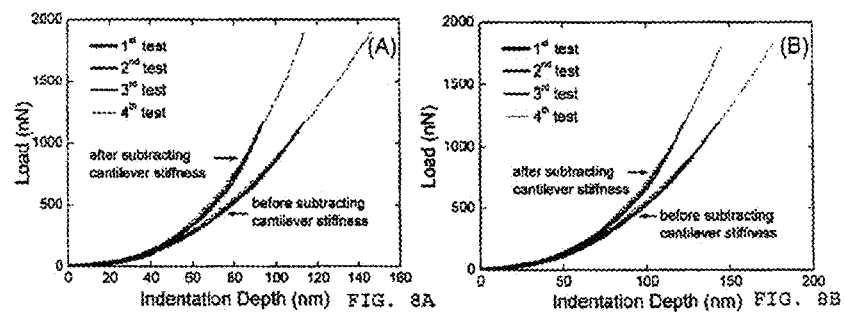
FIG. 8A shows an example of measured force vs. displacement for four sequential tests on a 1 μm diameter membrane. The lower curves show an example of the measured force vs. z piezo displacement, while the upper curves show an example of the force vs. membrane displacement, such as obtained after subtracting the cantilever deflection.
FIG. 8B shows an example of measured force vs. displacement curves for a 1.5 μm membrane.

FIG. 8 shows an example of the measured load vs. indentation depth for two membranes, each tested four times to successively deeper indentation depths. In an example, the membrane deflection can be obtained by subtracting the tip deflection from the z piezo displacement: $\delta = \delta_{piezo} - F/k$.

Young's Modulus, Pre-Tension, and Ultimate Strength Analysis

As discussed in Example 1, above, the force vs. displacement curves can be modeled as a clamped circular elastic membrane under point load. There is believed to be no closed-form analytical solution that accounts for both finite deformation as well as a pre-tension in a material that has a Poisson's ratio other then one-half. Even solutions that do exist for special cases are approximate. In an example, we can combine solutions from two special cases to obtain an expression for the force-displacement relationship that agrees with a numerical solution to within experimental uncertainty. An example of one such special case is that of a membrane with a large initial pre-tension as compared to the additional induced stress at very small indentation depths, which exhibits a linear force-displacement relationship. An example of another special case is valid for stresses much greater than the initial pre-tension, in which case the force varies as the cube of displacement. In an example, the sum of these two special cases can be employed to analyze the data.

For a clamped freestanding elastic thin membrane under point load, when bending stiffness is negligible and load is small, the relationship of force and deflection due to the pre-tension in the membrane can be approximately expressed, in an example, as:

$$F = (\pi \sigma_0^{2D}) \delta \quad \text{Eq. S2}$$

where F is applied force, $\sigma_0^{2D}$ is the membrane pre-tension, and $\delta$ is the deflection at the center point. When $\delta/h \gg 1$, the relationship of deflection and force can be expressed as $$\frac{\delta}{a} = \frac{1}{q}\left(\frac{F}{E^{2D}a}\right)^{\frac{1}{3}} \quad \text{Eq. S3}$$

where a is the radius of the membrane, $E^{2D}$ is the two-dimensional Young's Modulus, and $q = 1/(1.049 - 0.15v - 0.16v^2)$, with v is Poisson's ratio (taken here as 0.165, the value for bulk graphite).

Summing the contribution of the pre-tension term and the large-displacement term, we can write $$F = \sigma_0^{2D}(\pi a)\left(\frac{\delta}{a}\right) + E^{2D}(q^3 a)\left(\frac{\delta}{a}\right)^3. \quad \text{Eq. S4}$$

Figure 9:
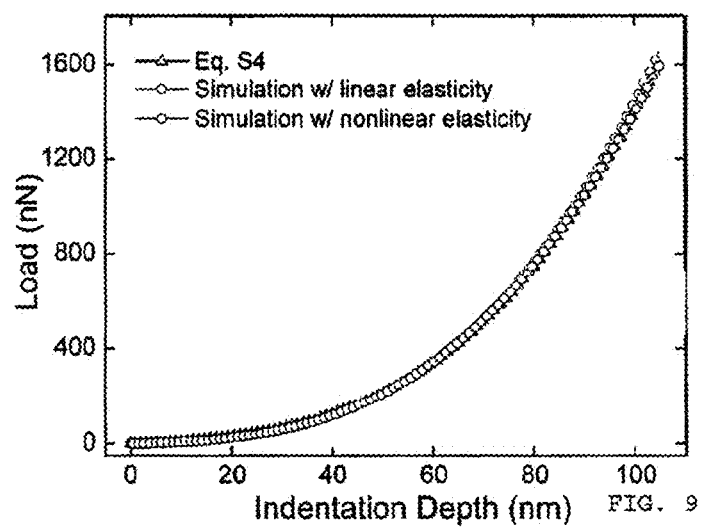
FIG. 9 shows an example of load and deflection curves such as can be obtained from Eq. S4, and FEM simulation results with both linear and nonlinear elasticity assumption. In this example, all curves are for 1 μm diameter graphene membrane with pre-tension input as 0.34 Nm$^{-1}$.

In an example, the Young's modulus, $E^{2D}$, and pre-tension, $\sigma_0^{2D}$, can be characterized by least-squares fitting the experimental curves using the above equation. This relationship, while approximate, is shown in FIG. 9 to agree with the numerical solution to within the uncertainty of the experiments.

Since the point-load assumption yields a stress singularity at the center of the membrane, one can consider the indenter geometry in order to quantify the maximum stress under the indenter tip. One can express the maximum stress for the thin clamped, linear elastic, circular membrane under a spherical indenter as a function of applied load $$\sigma_m^{2D} = \left(\frac{FE^{2D}}{4\pi R}\right)^{\frac{1}{2}} \quad \text{Eq. S5}$$

where $\sigma_m^{2D}$ is the maximum stress and R is the indenter tip radius. This equation implies that the breaking force is mainly a function of indenter tip radius, and is not affected by membrane diameter when $R/a \ll 1$, and this is consistent with our observation. As shown in FIG. 4A, the breaking force with the 16.5 nm radius tip was about 1.8 μN for both membrane sizes (e.g., 1 μm and 1.5 μm diameter), while the breaking force for the 27.5 nm radius tip was about 2.9 μN.

Numerical simulations were performed with ABAQUS using the finite element method (FEM) to verify the applicability of the previous two equations. In an example, simulations were done with a 1-μm-diameter membrane with a nominal thickness of 0.335 nm. In an example, two-node, linear interpolation, axisymmetric membrane elements were chosen. In an example, a total of 800 elements was used along the 500 nm radius, in an example, with a mesh density of about 6 elements per nm at the outer part of the membrane, while in the middle of the membrane radius, the mesh density was about 2 elements per 3 nm. In an example, at maximum deflection, about 50 elements were in contact with the tip which was modeled as a rigid sphere with radius of 16.5 nm. The contact condition was defined as frictionless and finite slip was allowed. In an example, the simulation was performed by specifying a 110 nm indentation depth of the rigid tip applied in 1000 increments.

A non-linear elastic constitutive behavior was assumed, since molecular dynamics simulations can infer that carbon nanotubes and graphene show nonlinear elasticity at large strain beyond 10%. In an example, this kind of nonlinear elastic behavior can be express under a uniaxial load as $$\sigma = E\epsilon + D\epsilon^2 \quad \text{Eq. S6}$$

where D is the third-order elastic constant, $\sigma$ is the symmetric second Piola-Kirchhoff stress, and $\epsilon$ is the uniaxial Lagrangian strain. One can define an effective thickness of the membrane for the simulation. In an example, the value of 0.335 nm was employed along with relevant 3D stress and elastic moduli, which were subsequently scaled to the 2D quantities. In an example, the membrane thickness was constrained to be constant during deformation. In an example, the in-plane Poisson's ratio was taken as 0.165, consistent with the in-plane Poisson's ratio of graphite. In an example, the non-linear elastic behavior of the above equation was implemented numerically as an elastic-plastic constitutive model, since an elastic-plastic behavior is comparable to a nonlinear elastic model as long as no unloading occurs.

In an example, it was assumed (based upon preliminary simulations) that the non-linear term in the above example would affect the stress primarily in the most highly strained portions of the membrane under or near the indenter. As a consequence, the predicted force-displacement curve was expected to be insensitive to D, which implies that the use of the linear-elastic constitutive relationship in Eq. S4 is not inconsistent with the non-linear elastic constitutive relationship of Eq. S6. To validate this assumption, after determination of E and D (based upon the discussion below), the force-displacement response was simulated assuming a linear as well as a non-linear elastic relationship. As seen in the example of FIG. 8, the difference between the force-displacement responses was smaller than the experimental uncertainties. Further the results indicated that only about 1% of the graphene membrane achieved a strain higher than about 5%, the threshold above which the non-linear term is important.

Therefore, in an example, the experimental force-displacement data sets were fit to Eq. S4, such as to determine the pre-tension, $\sigma_0^{2D}$, and the elastic modulus, $E^{2D}$. An example of a typical result is shown in FIG. 2A. In an example, the average value of $E^{2D}$=342 Nm$^{-1}$ (with standard deviation 40 Nm$^{-1}$) was obtained based upon 67 force-displacement curves from 23 suspended graphene membranes (e.g., with diameters 1 μm and 1.5 μm) from two separate graphene flakes.

The value of D for most materials is negative, which reflects a softening of the elastic stiffness at large tensile strains, and graphene is no exception. Given D<0, the non-linear elastic response predicts a maximum stress that can be supported by the material prior to failure, here denoted as the intrinsic stress with value $\sigma_{int}=-E^2/4D$ at the strain $\epsilon_{int}=-E/2D$. Beyond $\epsilon_{int}$ the slope of the stress-strain relationship is negative. In an example, FEM simulations of the deformed graphene membranes fail to find an equilibrium solution once the strains under the indenter tip have exceeded $\epsilon_{int}$. The force on the indenter at the point of instability can then be interpreted as the breaking force of the membrane. Therefore, the value of D can be determined from the experimental data such as by matching the predicted breaking force with the mean value of the experimentally determined breaking force. Doing so yields a value of to $D^{2D}=-690$ Nm$^{-1}$, in an example. This value is consistent with the breaking force for both indenter radii employed in the experiments.

Figure 10:
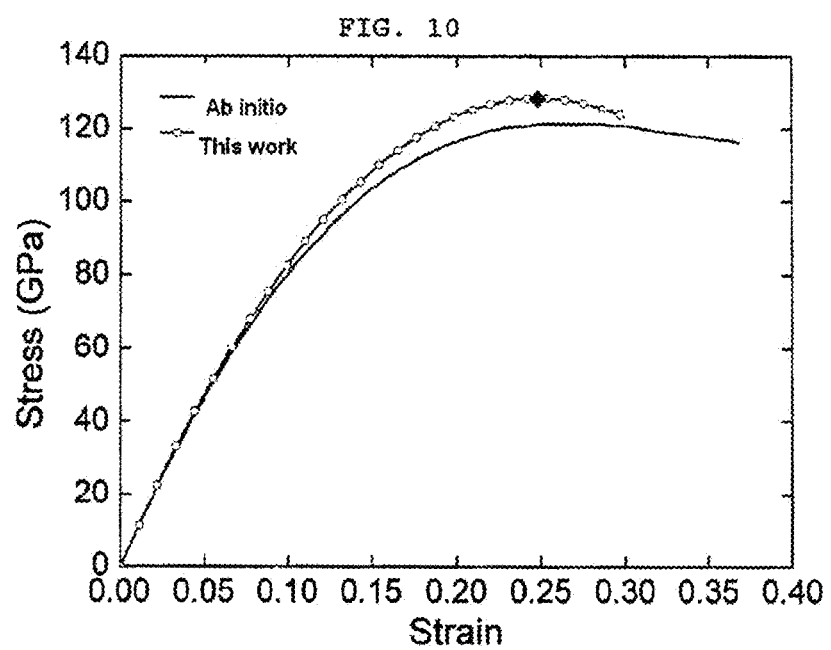
FIG. 10 shows an example of non-linear elastic properties of graphene (dashed line) that can be deduced from analysis of experiments. In this example, the diamond point denotes the maximum stress where slope is zero. The stress-strain curve from ab initio calculations is represented by a solid line.
Figure 11:
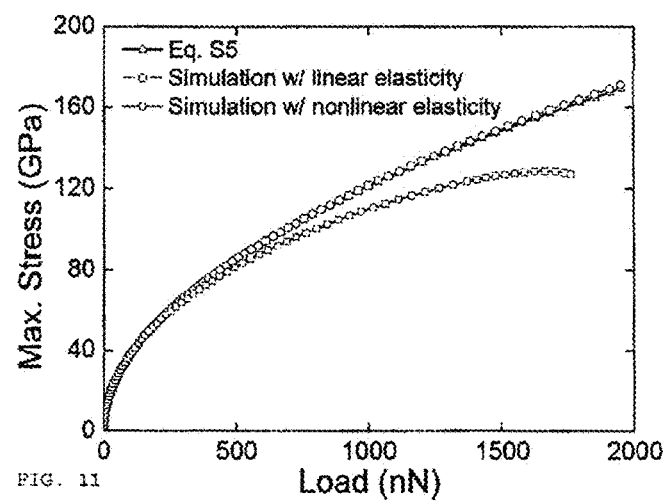
FIG. 11 shows an example of maximum stress vs. load curves, such as can be obtained from Eq. S5, and FEM simulation results with both linear and nonlinear elasticity assumption with a 1 μm diameter graphene membrane and a 16.5 nm indenter radius.

An example of the resulting experimentally obtained stress-strain response based upon the non-linear constitutive form of Eq. S5 is shown in the example of FIG. 10. In an example, the resulting intrinsic stress is $\sigma_{int}^{2D}=42$ Nm$^{-1}$ at a strain of $\epsilon_{int}=0.25$.

Weibull Statistics

It is submitted, based upon a statistical analysis, that the breaking stress under the indenter tip corresponds to that of the intrinsic maximum stress of the graphene. The Weibull probability distribution can be used to quantify the likelihood of failure of a brittle system. The two-parameter Weibull probability distribution, which can be used for fracture strengths that on depend pre-existing defects in the material with random distributions of size, distribution and orientation, is:

$$P = 1 - \exp[-(F_f/F_0)^m] \quad \text{Eq. S7}$$

where P is the probability of failure at a given breaking force $F_f$. In addition, $F_0$ is a nominal force associated with the distribution, and m is the so-called Weibull modulus that determines the breadth of the probability distribution. A small value of m indicates a wide variation in breaking force, which implies a broad range of defects in the material. A large value of m indicates either that the failure mode is insensitive to the presence of defects or that there is a small range of defects in the material.

Figure 12:
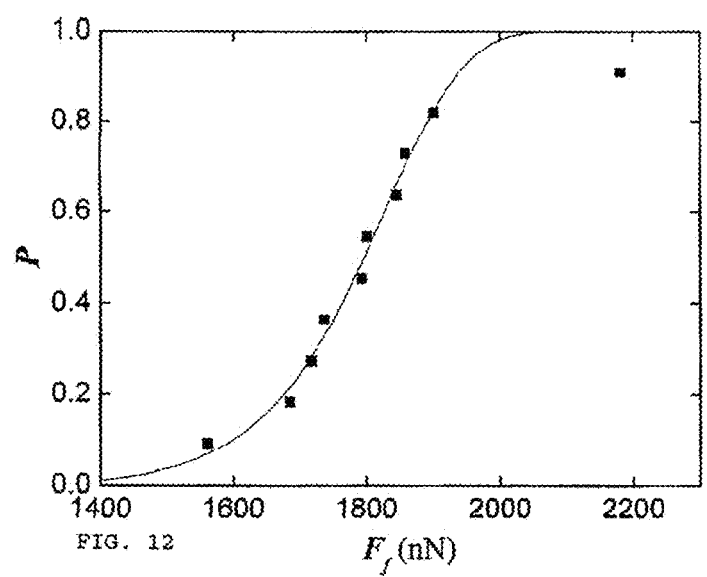
FIG. 12 shows an example of a two-parameter cumulative Weibull probability distribution for analysis of breaking force distribution for 16.5 nm tip on Flake #2; for this case, m=16.3 and $F_0$=1837 nN.

Examples of the histograms of breaking force, $F_f$, for both indenter tip radii are shown in FIG. 4B. For both cases, the Weibull modulus is about m≈16. The cumulative Weibull probability distribution for one case is shown in FIG. 12. A more appropriate measure of the propensity of failure, however, is to use the stress at failure. In an example, we can use Eq. S5 to convert the breaking force distribution to the stress at failure assuming a linear elastic behavior (which will be similar in trend to the non-linear elastic case as seen in the example of FIG. 10. Under those conditions, the maximum stress scales as the square root of $F_f$, the Weibull modulus for the maximum stress distribution will be m≈30, which implies a very narrow probability distribution. In an example, experimental analysis for the distribution of breaking stresses of single and multi-walled carbon nanotubes has a very small Weibull modulus that ranges from 1.75 <m<4 and computer simulations of defects in graphene sheets suggest a value of m≈3. In both of these cases, the small value of Weibull modulus indicates a very strong sensitivity of the breaking stress of the material as a function of the presence of initial defects. On the other hand, the high value of Weibull distribution, m≈30, in the present experiments is indicative that the graphene membranes are entirely free of defects, at in the region of highest stress under the indenter tip.

Other measurements by Scanning Tunneling Microscopy (STM) of graphene sheets on the same Kish graphite source indicate that graphene sheets deposited in silicon substrates as described above have zero defects in them over an area of hundreds of square nanometers, which is the size scale of the very highly stressed region under the AFM tip.

Uncertainty Analysis

In an example, displacement sensing of the AFM was calibrated to estimate its accuracy using National Institute of Standards and Technology (NIST) traceable standard calibration gratings, from Mikromasch (TGZ01: 18±1 nm, TGZ02: 102±1.5 nm, TGZ02: 498±6 nm). In an example, each grating was scanned at 9 different spots using contact scan mode, and the step heights were averaged. In an example, calibration on those standard specimens shows that the displacement, δ, measurement accuracy up to 100 nm depth is within 3.2%.

The uncertainty of the force measurement, F=k·δ, is given as $$\frac{\Delta}{F} = \sqrt{\left(\frac{\Delta\delta}{\delta}\right)^2 + \left(\frac{\Delta k}{k}\right)^2} \qquad \text{Eq. S8}$$

which gives accuracy of force measurement is about ±9.5% considering the error from spring constant, k, calibration, which is about 9%. In an example, from Eq. S4, assuming the uncertainty of the measurement of the tip radius and membrane radius to be relatively small, the uncertainty of the elastic modulus measurement is approximately $$\frac{\Delta E}{E} = \sqrt{\left(\frac{\Delta F}{F}\right)^2 + \left(3\frac{\Delta\delta}{\delta}\right)^2} \qquad \text{Eq. S9}$$

which yields 14%, so that the elastic modulus is 340±50 Nm$^{-1}$. The pre-tension uncertainty should be of the same order as that of the Young's modulus. From the nonlinear elasticity simulation results of maximum stress under the indenter tip shown in FIG. 10, we assume the empirical relationship for purposes of uncertainty evaluation to be $$\sigma_{int}^{2D} = \left(\frac{E^{2D}}{4\pi R}\right)^{1/2} F_f^{1/2} + B \cdot F_f^m. \qquad \text{Eq. S10}$$

The exponent is about n≈0.1 as obtained by least-squares curve fitting of data points of $\sigma_m^{2D}$ and $F_f$ in FIG. 10. Thus the uncertainty of $\sigma_{int}^{2D}$ can be expressed as $$\Delta\sigma_{int}^{2D} = \sqrt{\left(\frac{\partial\sigma_{int}^{2D}}{\partial E^{2D}}\Delta E^{2D}\right)^2 + \left(\frac{\partial\sigma_{int}^{2D}}{\partial F_f}\Delta F_f\right)^2}. \qquad \text{Eq. S11}$$

From the uncertainty of Young's modulus and force measurement given above, Eq. S11 gives accuracy of $\sigma_{int}^{2D}$ as 10%. Therefore the intrinsic strength, $\sigma_{int}^{2D}$, is 42±4 GPa, in an example.

Finally, since $\sigma_{int}=-E^2/4D$, we can estimate an uncertainty of $$\frac{\Delta D^{2D}}{D^{2D}} = \sqrt{\left(2\frac{\Delta E^{2D}}{E^{2D}}\right)^2 + \left(\frac{\Delta\sigma_{int}^{2D}}{\sigma^{2D}}\right)^2}. \qquad \text{Eq. S12}$$

Then, the value of the third-order elastic modulus, $D^{2D}$, is -690±120 Nm$^{-1}$, in an example.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a substrate, including a substantially circular well;
   a deformable sheet membrane, suspended over the well, the membrane configured to include a specified integer number of one or more monolayers; and
   a processor-readable storage medium comprising:
      accompanying information about the suspended membrane or the substrate that, with a deflection displacement response of the suspended membrane to an applied force or pressure, provides a measurement of the applied force or pressure; and
      instructions that, when performed by a processor, cause the processor to calibrate a transducer using the accompanying information about the deflection displacement response of the suspended membrane to the applied force or pressure.

2. The apparatus of claim 1, wherein the storage medium comprises accompanying information about at least one of a dimension of the well or a tension of the membrane.

3. The apparatus of claim 1, further comprising the transducer configured to transduce a deflection of the membrane, for use with the accompanying information, to provide the measurement of the applied force or pressure.

4. The apparatus of claim 3, wherein the transducer comprises at least one of an atomic force microscope (AFM) or a nanoindenter.

5. The apparatus of claim 1, comprising a plurality of wells, included on the substrate, and corresponding suspended membranes.

6. The apparatus of claim 1, wherein the membrane comprises graphene.

7. The apparatus of claim 6, wherein the membrane consists of graphene.

8. A method comprising:
   using a substrate including a substantially circular well;
   using a deformable sheet membrane that is suspended over the well, the membrane configured to include a specified integer number of monolayers; and
   calibrating a device using a deflection displacement response of the suspended membrane to an applied force or pressure.

9. The method of claim 8, comprising calibrating the device using (1) information about the suspended membrane or the substrate and (2) the deflection displacement response of the suspended membrane to an applied force or pressure.

10. The method of claim 8, comprising using measured information about a diameter of the well in performing the calibrating.

11. The method of claim 8, comprising using measured information about a tension of the membrane in performing the calibrating.

12. The method of claim 11, comprising using measured information about the tension of the membrane in performing the calibrating, wherein the measured information is obtained using x-ray diffraction.

13. The method of claim 11, comprising using measured information about the tension of the membrane in performing the calibrating, wherein the measured information is obtained using Raman spectroscopy.

14. The method of claim 8, wherein using a deformable sheet membrane comprises using a material comprising graphene.

15. The method of claim 14, wherein using a deformable sheet membrane comprises using a material consisting of graphene.

16. The method of claim 8, wherein the calibrating comprises:
   measuring a deflection of the membrane; and
   providing information about the deflection to a user or automated process.

17. The method of claim 16, wherein the measuring the deflection of the membrane comprises using the device being calibrated for measuring the deflection of the membrane.

18. The method of claim 8, wherein the calibrating the device comprises calibrating an atomic force microscope (AFM).

19. The method of claim 8, wherein the calibrating the device comprises calibrating a nanoindenter.

20. A method of claim 8, comprising:
   measuring at least one of a diameter of the well or a tension of the membrane; and
   providing a user or automated process with information about at least one of the diameter of the well or a tension of the membrane.

21. A method comprising:
   providing an apparatus comprising:
      a substrate, including a substantially circular well;
      a deformable sheet graphene membrane, suspended over the well, the membrane configured to include a specified integer number of one or more graphene monolayers; and
      a storage medium comprising accompanying information about the suspended membrane or the substrate that, with a deflection displacement response of the suspended membrane to an applied force or pressure, provides a measurement of the applied force or pressure, wherein the storage medium comprises accompanying information about a dimension of the well and a tension of the membrane;
      a transducer configured to transduce a deflection of the membrane, for use with the accompanying information, to provide the measurement of the applied force or pressure, wherein the transducer comprises at least one of an atomic force microscope (AFM) or a nanoindenter; and
   calibrating at least one of an atomic force microscope (AFM) device or a nanoindenter device, using (1) information about the suspended membrane or the substrate, including using measured information about a diameter of the well and measured information about a tension of the membrane obtained using at least one of x-ray diffraction or Raman spectroscopy, and (2) the deflection displacement response of the suspended membrane to an applied force or pressure, wherein the calibrating comprises
   measuring a deflection of the membrane; and
   providing information about the deflection to a user or automated process.

22. The apparatus of claim 4, wherein the processor-readable medium includes instruction to calibrate the transducer using measured information about a diameter of the well and measured information about a tension of the membrane.

23. The apparatus of claim 22, wherein the measured information about the tension of the membrane is obtained using at least one of x-ray diffraction or Raman spectroscopy.

* * * * *

UNITED STATES PATENT AND TRADEMARK OFFICE
CERTIFICATE OF CORRECTION

PATENT NO. : 8,418,547 B2  Page 1 of 1
APPLICATION NO. : 13/057701
DATED : April 16, 2013
INVENTOR(S) : Kysar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 58 days.

Signed and Sealed this

First Day of September, 2015

Michelle K. Lee
*Director of the United States Patent and Trademark Office*